(12) United States Patent
Mathea et al.

(10) Patent No.: US 7,993,960 B2
(45) Date of Patent: Aug. 9, 2011

(54) ELECTRONIC DEVICE AND METHOD OF MANUFACTURING THE SAME

(75) Inventors: Arthur Mathea, Berlin (DE); Joerg Fischer, Berlin (DE); Marcus Schaedig, Königs Wusterhausen (DE)

(73) Assignee: Samsung Mobile Display Co., Ltd., Yongin (KR)

( * ) Notice: Subject to any disclaimer, the term of this patent is extended or adjusted under 35 U.S.C. 154(b) by 359 days.

(21) Appl. No.: 11/956,163

(22) Filed: Dec. 13, 2007

(65) Prior Publication Data

US 2008/0143251 A1 Jun. 19, 2008

(30) Foreign Application Priority Data

Dec. 13, 2006 (EP) .................................... 06126004
Apr. 12, 2007 (KR) .................... 10-2007-0036180

(51) Int. Cl.
*H01L 21/00* (2006.01)
(52) U.S. Cl. ... 438/99; 438/149; 438/151; 257/E21.244; 257/E21.249; 257/E21.255
(58) Field of Classification Search ........... 257/E21.244, 257/E21.249, E21.255; 438/22, 99, 149, 438/151
See application file for complete search history.

(56) References Cited

U.S. PATENT DOCUMENTS

| 7,176,040 | B2 | 2/2007 | Sirringhaus et al. |
| 7,431,860 | B2 | 10/2008 | Kawase |
| 7,535,169 | B2 | 5/2009 | Kobayashi |
| 7,560,133 | B2 | 7/2009 | Kawase |
| 7,572,651 | B2 | 8/2009 | Sirringhaus et al. |
| 2002/0158835 | A1 | 10/2002 | Kobayashi |
| 2003/0029831 | A1 | 2/2003 | Kawase |
| 2005/0179373 | A1 | 8/2005 | Kobayashi |
| 2006/0115998 | A1 | 6/2006 | Shin |
| 2006/0264049 | A1 | 11/2006 | Ittel |

FOREIGN PATENT DOCUMENTS

| CN | 1404625 | 3/2003 |
| CN | 1463472 | 12/2003 |
| GB | 2 367 788 | 4/2002 |
| GB | 2 374 202 | 10/2002 |
| JP | 2002-026229 | 1/2002 |
| JP | 2003-518755 | 6/2003 |
| JP | 2004-512642 | 4/2004 |
| JP | 2005-268202 | 9/2005 |
| KR | 10-2002-0067976 A | 8/2002 |
| KR | 10-2006-0024940 A | 3/2006 |

OTHER PUBLICATIONS

Registration Determination Certificate issued on Aug. 28, 2008 in the Korean Patent No. 10-2007-0036180.
European Search Report dated May 31, 2007 for Application No. EP 06 12 6004, 6 pages.
Office Action issued by Chinese Patent Office dated Jul. 5, 2010.

*Primary Examiner* — Minh-Loan T Tran
(74) *Attorney, Agent, or Firm* — Knobbe Martens Olson & Bear LLP

(57) ABSTRACT

Provided are an electronic device including a bank structure and a method of manufacturing the same. The method of manufacturing the electronic device requires a fewer number of processes and comprises a direct patterning of insulating layers, such as fluorinated organic polymer layers, is possible using cost-efficient techniques such as inkjet printing.

19 Claims, 11 Drawing Sheets

ELECTRONIC DEVICE AND METHOD OF MANUFACTURING THE SAME

CROSS REFERENCE TO RELATED APPLICATIONS

This application claims the benefit of European Patent Application No. 06 126 004.8, filed on Dec. 13, 2006 and Korean Patent Application No. 10-2007-0036180, filed Apr. 12, 2007, the disclosures of which are incorporated by reference in their entireties.

BACKGROUND

1. Technical Field

This disclosure relates generally to an electronic device and a method of manufacturing the same, and more particularly, to an organic light emitting diode comprising a bank structure and a method of manufacturing the same; and also relates to an electronic device comprising a bank structure having conductive lines and a method of insulating the conductive lines used in the electronic device; and further relates to a method of forming a gate electrode of a thin film transistor (TFT) of an organic light emitting diode (OLED) and an electrophoretic device.

2. Description of the Related Art

According to the present state of the art, there is no convenient method of direct patterning insulating materials such as fluorinated organic polymers. As used herein, the term "insulating material" is understood to be a material with a breakthrough voltage of about 2.0 MV/cm or more. Therefore, it is desirable to provide a patterning method of insulating materials, such as fluorinated organic polymers, using cost-efficient techniques such as inkjet printing.

For example, in the manufacture of an organic light emitting diode (OLED) display device, liquid ink containing an organic electroluminescent material can be applied onto pixel areas of the OLED display device. However, due to ink wetting issues, a bank structure is used in many inkjet patterning processes to provide the desired pattern, for example, to reduce ink overflow into adjacent pixel areas of the OLED display device. However, the manufacture of such a bank structure requires the use of a photoresist in a photolithography process, followed by one or more fluorination processes to generate an efficient working bank that comprises mechanical barriers, as well as a pattern of hydrophilic and hydrophobic areas. Accordingly, processes that use bank structures to avoid ink overflow results in a greater number of process operations.

SUMMARY OF THE INVENTION

Some embodiments described herein provide a method of manufacturing an electronic device including a bank structure requiring a fewer number of processes in which a direct patterning of insulating layers, such as fluorinated organic polymers, is possible by using cost-efficient techniques, such as inkjet printing, As well as an electronic device manufactured using the method.

Some embodiments comprise a patterning method that makes it simple to produce many convenient structures, which reduces process operations, and increases the performance of an electronic device and a fill factor of display elements. With the new technique, it is possible to fabricate alignment structures for succeeding printing processes, e.g., in the manufacture of organic display devices. The reduction in process operations by the use of patterned fluorinated organic polymers as a self-alignment (no wetting) layer for succeeding coatings is an additional benefit. Furthermore, embodiments of the patterning method are roll-to-roll compatible, and therefore, flexible substrates are processable therewith.

Some embodiments also provides a method of manufacturing an electronic device including applying an organic insulating layer including an organic insulating material on a substrate, and patterning the organic insulating layer by applying an organic solvent to the organic insulating layer.

In some embodiments, the organic solvent is applied to the surface of the organic insulating layer that is coated with functional layers, such as polymers and fluoropolymers. In some embodiments, the organic solvent is preferably applied by inkjet printing, for example, as a stream of droplets.

The applied organic solvent dissolves some of the organic insulating material, and the solution of the dissolved material flows laterally due to kinetic energy of the droplet of organic solvent. The ensuing solvent droplets dissolve more of the organic insulating material in the same area, thereby thinning the area and forming a first groove, hole, hollow, or recess. The highly concentrated solution thus generated has enough kinetic energy to exit from the resulting first groove formed in the insulating layer. Because the organic solvent has a low boiling point, the organic solvent quickly evaporates and the dissolved insulating material quickly solidifies, accumulating in a second area at which solvent is not applied, thereby increasing the thickness of the layer of organic insulating material at the second area. The second area is in the vicinity of, peripheral to, or adjacent to the first groove. Thus, protrusions are formed on the second area due to the accumulated organic insulating material.

This organic insulating accumulated material can, for example, be used to cover conductive lines or as a bank for succeeding processes. By using fluorinated insulators and fluorinated solvents, self assembled structures can be produced very easily, and that way, a patterned ancillary can support succeeding patterning methods.

Subsequently, the organic insulating material may be completely or partially removed using the organic solvent. Alternatively, the organic insulating material may be partially removed from the first area by applying the organic solvent and then completely removed using plasma etching. A conductive layer may be formed on the patterned organic insulating layer, and used as a conductive line, a gate electrode, a pixel electrode, a capacitor electrode, or the like.

Embodiments of the method may further include forming a first conductive layer on the substrate. Then, the organic insulating layer is formed on the first conductive layer, and the organic insulating layer is patterned to expose the first conductive layer by applying the organic solvent to the organic insulating layer. An electroluminescent layer may further be formed on the exposed first conductive layer. Thus, the first conductive layer may be used as a pixel electrode of light emitting devices.

Alternatively, the organic insulating layer is formed on the first conductive layer, and then the organic insulating layer is patterned by partially removing the organic insulating layer so as to not expose the first conductive layer. Then, a second conductive layer may be formed on the patterned organic insulating layer. The first conductive layer, the organic insulating layer, and the second conductive layer may be a capacitor device comprising a pair of capacitor electrodes and a dielectric substance.

All in all, provided is a simple and fast, one-step patterning method to achieve several structures on coated materials, which is especially applicable to organic electronics, which can further be formed on flexible substrates. Organic devices like OLED displays or organic thin film transistor (OTFT) circuits comprise many different active and inactive components, which are preferably produced at a low cost. This new technology allows the production of many of these active and inactive components in a simple way with an improvement in performance and a reduction in the number of process operations.

Furthermore, some embodiments provide an electronic device including a substrate, and an organic insulating layer that is formed on the substrate and that comprises an organic insulating material, wherein the organic insulating layer includes a first area having a first groove, and a second area having at least one protrusion that is to be connected to the first groove.

As used herein, the term "protrusion" refers to a region having a thicker organic insulating layer as compared to a region of the organic insulating layer to which the organic solvent has not yet been applied.

The thickness of the organic insulating layer in the first area is reduced due to the organic solvent applied thereto in order to form the first groove, and the dissolved organic insulating material from the first area accumulates on the second area adjacent to the first area to form the protrusion. The second area may include a plurality of protrusions, and a second groove may be formed by the plurality of the protrusions. By applying the organic solvent to the organic insulating layer, the organic insulating material of the first area is completely or partially removed, thereby reducing the thickness of the organic insulating layer from the initial thickness of the organic insulating layer. In contrast, because the second groove is formed by the protrusions on the organic insulating layer, the thickness of the organic insulating layer in the second groove is generally the same as or greater than the initial thickness of the organic insulating layer. Accordingly, the bottom of the second groove has a thicker organic insulating layer than the bottom of the first groove.

The electronic device may further include a first conductive layer disposed between the substrate and the organic insulating layer. The organic device may further include a second conductive layer that is formed in the first groove and/or the second groove, and/or encapsulated by one or more of the protrusions. The second conductive layer may be used as a gate electrode, a pixel electrode, a conductive line, a capacitor electrode, and the like.

According to a first aspect, there is provided a method of manufacturing an electronic device including forming at least one layer including an organic insulating material. The method includes providing a substrate; applying an organic insulating layer including an organic insulating material on the substrate; and applying an organic solvent directly onto the organic insulating layer. The use of an organic solvent results in a direct patterning method that requires a fewer number of process operations for manufacturing a bank structure for a display device, wherein the bank structure is used for a succeeding inkjet printing process for depositing a dissolved organic electroluminescent material. Preferably the thickness of the organic insulating material of the layer is reduced in a plurality of first areas by applying organic solvent in each of the first areas, wherein no organic solvent is applied onto a second area or onto a plurality of second areas, wherein each second area is defined as an area between adjacent first areas. Preferably each first area is configured to form a pixel area of an organic electroluminescent display, and each second area is configured to form a non-pixel area of an organic electroluminescent display. Therefore, a bank structure comprising a plurality of pixel areas can be manufactured by a direct patterning method. The first areas/pixel areas are configured to form mechanical barriers for an ink (to be printed) such that an ink overflow into adjacent pixel areas can be avoided during the manufacture of an OLED display, for example.

Therefore, preferably each first area is separated from an adjacent first area by a second area, and the thickness of the organic insulating material of the layer in each second area is greater than the thickness of the organic insulating material of the layer in an adjacent first area. Preferably the organic solvent is applied onto a plurality of first areas arranged in a matrix. Alternatively it is possible that the organic solvent is applied onto a plurality of line-shaped first areas arranged generally parallel to each other, wherein each of the line-shaped first areas is configured to extend in a horizontal or in a vertical direction of an organic electroluminescent display and wherein each pair of adjacent line-shaped first areas are generally disposed at a uniform distance from each other.

The thickness of the insulating layer is reduced in a first area onto which the solvent is applied, and the thickness of a neighboring second area is furthermore increased by the accumulation of dissolved insulating material. Such bank structures can comprise barriers that are up to ten times higher than the pixel areas. Therefore, preferably the organic solvent is applied such that a thickness of the organic insulating material of the layer in each second area is at least about two times greater, more preferably, about five times greater, and still more preferably, about eight times greater, than the thickness of the organic insulating material of the layer in an adjacent first area. The exact reduction in the layer thickness of the layer in the first areas onto which organic solvent is applied can be controlled by parameters including: the material of the insulating layer, the starting thickness of the insulating layer, the solvent, the amount of solvent applied in the first area, as well as the surface dimensions of the first area. By the appropriate selection of the above mentioned parameters, it is possible to completely remove the organic insulating material in the first areas or to only reduce the thickness of the organic insulating material in the first areas. By control of the above mentioned parameters, the ratio of the thickness of the organic insulating material in the first area and the second area can also be controlled. For the use of a bank structure for the manufacture of an organic electroluminescent display, the first areas are preferably configured such that a pitch or distance between the centers of two adjacent first areas ranges between about 10 μm and about 150 μm, more preferably between about 30 μm and about 80 μm.

According to a second aspect, there is provided a method of manufacturing an organic electroluminescent display. The method includes providing a substrate; applying a first electrode layer onto the substrate, wherein the first electrode layer is preferably an anode layer; applying a layer of an organic insulating material onto the first electrode layer; and applying an organic solvent onto a plurality of first areas or pixel areas, thereby dissolving and completely removing the organic insulating material from the pixel areas such that the first electrode layer is exposed in the pixel areas. Furthermore, an organic electroluminescent layer is applied in each of the pixel areas and a second electrode is formed over the organic electroluminescent layer. Furthermore, it is preferred that the whole display device is encapsulated in order to prevent moisture and oxygen to deteriorate the organic electroluminescent material. Preferably, the organic electroluminescent layer consisting of an organic electroluminescent material is applied onto each of the first electrode layers by inkjet printing or spin coating. Furthermore, it is preferred to apply the organic electroluminescent material onto the first electrode layer in each of the first areas or pixel areas by dipping if fluorinated organic insulating materials are used.

According to a third aspect, there is provided a method of manufacturing conductive lines. The method includes: providing a substrate; applying a layer of an insulating material onto the substrate; applying at least one conductive line onto the layer of the organic insulating material; and applying an organic solvent to at least a portion of an area neighboring the at least one conductive line, thereby accumulating dissolved insulating material on an edge and/or outer portion of an area onto which the solvent is applied, and thereby partially or completely covering and encapsulating the at least one conductive line with the dissolved organic insulating material. Accordingly, a very easy process for the encapsulation of conductive lines is provided. As already mentioned, the amount of accumulated material that is transported by the application of an organic solvent from an area onto which the solvent is applied to a neighboring area or an edge area can be easily controlled by the selection of the organic insulating material and/or thickness thereof, the organic solvent, amount of solvent, and/or surface area onto which the solvent is applied. For the encapsulation of a conductive line, it is preferred that at least one conductive line is formed with a width between about 1 µm and about 200 µm, and with a height of between about 0.03 µm and about 3 µm. More preferably, the width of the at least one conductive line ranges between about 5 µm and about 50 µm, and the height ranges from between about 0.1 µm and about 2 µm. Furthermore, preferably the area onto which the organic solvent is applied has a distance from the at least one conductive line of between about 10 µm and about 50 µm, more preferably, between about 20 µm and about 40 µm, and has a width in a direction perpendicular to the longitudinal axis of the at least one conductive line of between about 50 µm and about 500 µm, more preferably, between about 100 µm and about 300 µm. Furthermore, it is also possible to encapsulate two or more conductive lines at one time. In order to encapsulate two parallel conductive lines, organic solvent is applied onto an area between the conductive lines. Therefore, at least two parallel conductive lines extending along a first direction are formed on the layer of an organic insulating material, and the organic solvent is applied to at least a portion of an area between the at least two conductive lines, thereby dissolving organic insulating material in an area onto which the organic solvent is applied, and further covering the at least two parallel conductive lines with dissolved and accumulated insulating material at the same time. Preferably, the at least two parallel conductive lines are formed with a width of between about 10 µm and about 50 µm, more preferably, between about 20 µm and about 40 µm, and a height of between about 0.03 µm and about 3 µm, more preferably, between about 0.1 µm and about 2 µm, wherein the distance between adjacent parallel conductive lines ranges between about 70 µm and about 500 µm, more preferably, about 100 µm and about 400 µm. Furthermore, preferably the area onto which the organic solvent is applied has a distance from each of the at least two parallel conductive lines between about 10 µm and about 50 µm, more preferably, between about 20 µm and about 40 µm, and the area onto which the organic solvent is applied has a width in a direction perpendicular to the axis of the conductive lines of between about 50 µm to about 500 µm, more preferably, between about 100 µm and about 400 µm. Furthermore, it is possible to form additional conductive lines extending along a direction which is different from the direction of the conductive lines which have already been covered with insulating material by the above-described application of an organic solvent. More preferably, the additional conductive lines which are formed over the encapsulated conductive lines have a direction extending perpendicular to the direction of the encapsulated conductive lines.

As used herein, the terms "a first layer is applied on a second layer" or "a first layer is arranged on a second layer" or "a first layer is formed on a second layer" or "a first layer is formed above a second layer" refer to a first layer disposed directly on a second layer, as well as to arrangements in which at least one third layer is disposed between the first and second layer.

According to a fourth aspect, an array of organic thin film transistors can be easily manufactured by applying an organic solvent onto a layer of an organic insulating material. The method includes: providing a substrate; applying a plurality of functional layers including a source electrode, a channel area of semiconductor material, and a drain electrode; and covering the functional layers with an organic insulating layer of an organic insulating material. Then, for each TFT, a gate electrode layer is applied on the organic insulating layer in an area which is located above the channel area of each TFT. Then, an organic solvent is applied in a first area neighboring the gate electrode, thereby accumulating material, which encapsulates the gate electrode with the dissolved organic insulating material from the first area. The first area in which the organic solvent is applied forms a first groove. Preferably, the organic insulating layer is formed with a thickness of between about 0.1 µm and about 2 µm, more preferably, between about 0.5 µm and about 1.5 µm, and at least one gate electrode is formed with a width of between about 10 µm and about 300 µm, with a height of between about 0.3 µm and about 3 µm, and wherein the distance between the at least one gate electrode and the area in which the organic solvent is applied ranges from between about 10 µm and about 50 µm, more preferably, between about 20 µm and about 40 µm.

According to a fifth aspect, there is provided a display device including a thin film transistor coupled to a pixel electrode. A plurality of functional layers including a source electrode, a channel area, a drain electrode, and a pixel electrode are formed on a substrate, and an organic insulating layer is formed to the cover the functional layers. Then, an organic solvent is applied to a first area or pixel area of the organic insulating layer in which the pixel electrode layers are located, thereby accumulating organic insulating material in a second area corresponding to an adjacent source electrode layer and an adjacent drain electrode layer, thereby forming a protrusion. A plurality of protrusions may be formed by applying the organic solvent to both first areas neighboring a second area. Thus, a second groove may be formed by adjacent protrusions in the second area of the organic insulating layer, which corresponds to the channel area. A gate electrode is formed in each of the second grooves. Furthermore, the organic insulating material is preferably dissolved and completely removed from the first area onto which the organic solvent is applied, thereby forming a plurality of pixel areas. Preferably, a passivation layer is formed over each of the plurality of gate electrodes. Preferably the organic insulating layer is formed with a thickness of between about 0.1 µm and about 2 µm, more preferably, between about 0.5 µm and about 1.5 µm, and the distance between the at least one groove and the adjacent first area in which the organic solvent is applied ranges from between about 50 µm to about 500 µm, more preferably, between about 100 µm and about 400 µm.

According to a sixth aspect, there is provided a method of manufacturing at least one capacitor, wherein the capacitance of the capacitor may be adjusted by controlling the thickness of a dielectric layer. The method includes: providing a substrate; applying a first capacitor electrode on the substrate;

and applying an organic insulating layer on the first capacitor electrode. The organic insulating layer may be used as a dielectric layer interposed between capacitor electrodes. The organic insulating layer is preferably formed with a thickness of about 1 µm to about 5 µm. In order to control the thickness of the dielectric layer of the capacitor, the organic solvent is applied onto a portion of, and preferably onto the whole, first area in which the first capacitor electrode is located, thereby reducing the thickness of the organic insulating material. After reducing the thickness of the organic insulating material, the second capacitor electrode is formed over the organic insulating layer over at least a portion of the first area. Preferably, the thickness of the material that covers the first capacitor electrode is reduced to between about 50 µm and about 1000 nm, more preferably, between about 50 µm and about 500 nm. Preferably, the first capacitor electrode and the second capacitor electrode are each formed with lengths of between about 50 µm and about 500 µm and with widths of between about 50 µm and about 500 µm.

According to a seventh aspect, a plurality of functional layers is formed on a substrate and arranged in a matrix, each functional layer including a source electrode, a channel area, and a drain electrode. The functional layers are covered by an organic insulating layer, and an organic solvent is applied in first areas in which the channel areas are located, thereby reducing the thickness of the organic insulating material. Preferably, a gate electrode is formed over the organic insulating material in the first area. Preferably, the organic insulating material which covers the channel area is reduced to a thickness of between about 50 µm and about 1000 nm, more preferably, between about 50 µm and about 500 nm. Preferably, each of the channel areas is formed with a length of between about 5 µm and about 500 µm, and a width of between about 10 µm and about 500 µm.

According to an eighth aspect, there is provided a method of manufacturing a pixel defining layer for a display application. The method for manufacturing a plurality of pixel defining layers, preferably arranged in a matrix, includes: providing a substrate; applying a first electrode onto the substrate; applying an organic insulating layer over the first electrode; and applying an organic solvent into a plurality of first areas or pixel areas, thereby exposing the first electrode layer in the plurality of pixel areas and accumulating dissolved organic insulating material in areas neighboring the plurality of pixel areas, thereby forming a pixel defining layer. Preferably, the pitch between adjacent first areas or pixel areas, which is the distance between the centers of adjacent pixel areas, ranges from between about 10 µm to about 150 µm, more preferably, between about 40 µm and about 100 µm.

According to a ninth aspect, there is provided a method of manufacturing contact holes, via holes, and/or through holes in insulating layers. The method includes: providing a substrate, applying an organic insulating layer on the substrate; and applying an organic solvent onto a first area of the organic insulating layer in which a contact hole is to be formed. In order to reduce the resistance of the contact hole, a plasma etching treatment, preferably using argon plasma in a microwave plasma device, is provided. The plasma process can be carried out on the substrate comprising a plurality of contact holes, preferably arranged in matrix. The plasma process is carried out for a time of about 10 seconds to about 120 seconds. The power preferably ranges from between about 20 W and about 100 W. The gas flow preferably ranges between about 10 ccm to about 50 ccm. The electrode distance preferably ranges between about 15 mm and about 75 mm. The pressure preferably ranges between about 0.01 mbar and about 0.1 mbar. The substrate temperature is preferably room temperature.

The following general remarks apply to the first through ninth aspects. Preferably, the organic insulating layer includes an organic insulating material that is completely formed of an organic insulating material. Preferably, the organic insulating layer is formed by spin coating, dip coating, screen printing, or offset printing. Preferably, the organic insulating layer is formed with a thickness of between about 0.1 µm and about 3 µm. Preferably, the organic insulating layer includes an organic insulating material that includes a uniform thickness on the substrate onto which the layer is applied.

The organic insulating material may comprise a material selected from the group consisting of polyvinylphenol, polyvinyl alcohol, polyethylene, polystyrene, poly(methylmethacrylate), poly(butylmethacrylate), poly(cyclohexylmethacrylate), polyisobutylene, and polypropylene.

A fluorinated organic polymer may be used as the organic insulating material for the layer. The organic insulating material may comprise a material selected from the group consisting of polyhexafluoropropene, fluorinated poly-para-xylene, fluorinated polyaryl ether ketones, fluorinated polyalkyl ethers, fluorinated polyamide, fluorinated ethylene/propylene copolymer, poly-(1,2-difluoromethylene)-perfluoro-tetrahydrofuran, and polytetrafluorethylene.

The organic solvent may be a non-polar solvent. Preferably, the organic solvent comprises a solvent selected from the group consisting of methylene chloride, tetrahydrofuran, xylene, n-hexane, toluene, cyclohexane, anisole, 3,4-dimethylanisole, 1,2-dichlorobenzene, tetralin, 1,2,4-trimethylbenzene, 1,2,3-trimethylbenzene, 1,3,5-trimethylbenzene, methyl benzoate, ethyl benzoate, perfluoroheptane, perfluorooctane, perfluorononane, perfluorodecane, perfluoroundecane, perfluorododecane, perfluorodecalin, perfluoromethyldecalin, perfluoro-dimethyl ether, perfluoro-tetrahydrofuran, perflouromethyltetrahydrofuran, perflouro-ethyltetrahydrofuran, perflouro-dipropyl ether, perflourodiisopropyl ether, perfluoro-ethylpropyl ether, perfluoro-2-butyltetrahydrofuran, perfluorinated saturated tertiary amines, heptacosafluorotributylamine, and methoxynonafluorobutane.

BRIEF DESCRIPTION OF THE DRAWINGS

The above and other features and advantages will become more apparent by describing in detail exemplary embodiments thereof with reference to the attached drawings in which.

DETAILED DESCRIPTION OF CERTAIN EMBODIMENTS

Figure 1A:
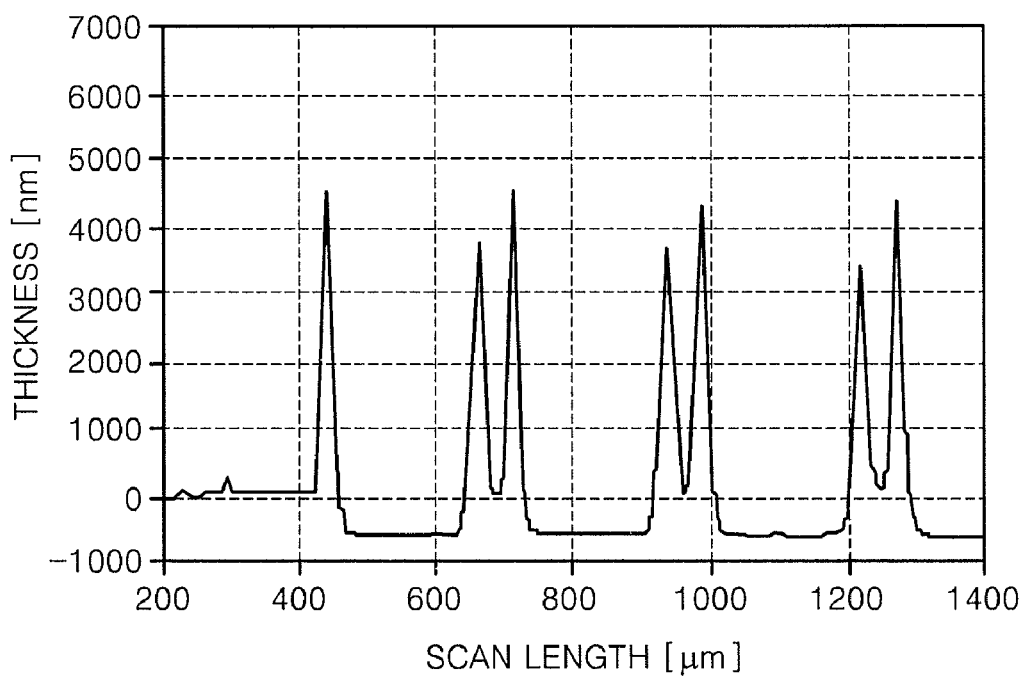
FIGS. 1A-1D illustrate cross-sectional views of an embodiment of a bank structure of a substrate that can be used for the manufacture of an organic light emitting diode (OLED)

Hereinafter, certain embodiments will now be described more fully with reference to the accompanying drawings, which illustrate exemplary embodiments. In general, it shall be noted that reference characters are not attached to every element in every drawing for clarity, but only when an element is shown the first time. Therefore, it should be understood that elements having the same hatching represent the same functional elements.

FIGS. 1A to 1D are cross-sectional views an embodiment of a bank structure on a substrate employed in the manufacture of an organic light emitting diode (OLED). The units of the horizontal axes are μm and the units of the vertical axes are μm in FIGS. 1A-1D.

Figure 1B:
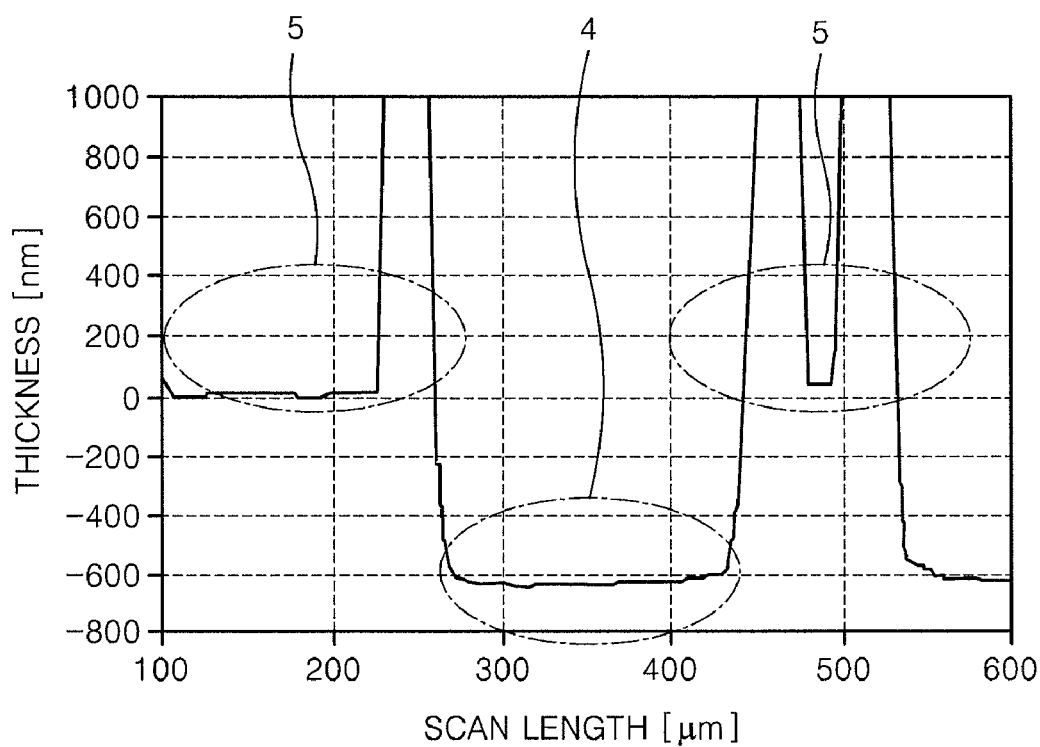

FIG. 1A shows a cross-sectional view an embodiment of the bank structure of the substrate that can be used for the manufacture of an OLED. FIG. 1B shows an enlarged view of the bank structure of the substrate of FIG. 1A. In order to obtain a substrate having the bank structure that can be used for an OLED manufacturing process, the illustrated embodiment provides a supporting substrate onto which a layer of an organic insulating material is applied. In some embodiments, the layer of the organic insulating material is a substantially continuous layer. In order to obtain the bank structure, an organic solvent (not shown) is applied onto a plurality of first areas 4 that define the pixel areas in the OLED manufacturing process, as illustrated in FIG. 1B. The organic solvent (not shown) dissolves the organic insulating material in the pixel areas and accumulates the dissolved organic insulating material in a second area 5 adjacent to the pixel area. The second area 5 is characterized as a non-pixel area. Depending on the amount of organic solvent applied and the distance between adjacent pixel areas, the non-pixel area 5 can comprise a single ridge of organic insulating material (see FIGS. 1C and 1D), or by a double ridge of organic insulating material (see FIGS. 1A and 1B). Furthermore, it is possible to form very steep protrusions or ridges in the non-pixel areas 5, wherein the protrusions have a height that can be up to ten times higher than the thickness of the organic insulating material in the pixel areas 4. Furthermore, it is possible to completely remove the organic insulating material from the pixel areas 4 or to only reduce and control the thickness of the layer in the pixel areas 4 to a certain amount.

Figure 1C:
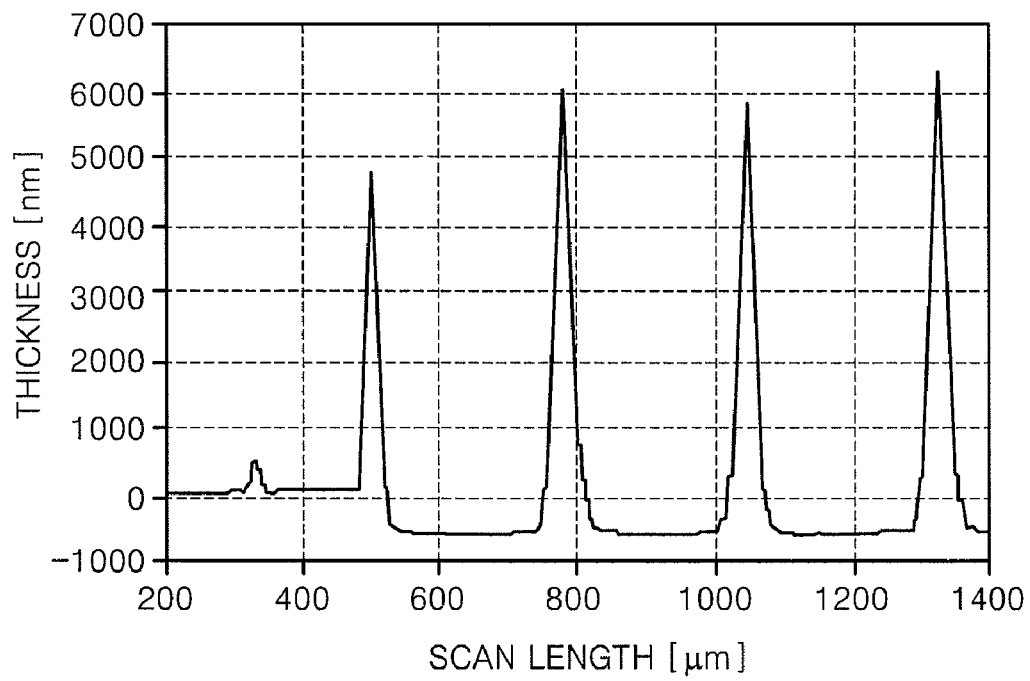
Figure 1D:
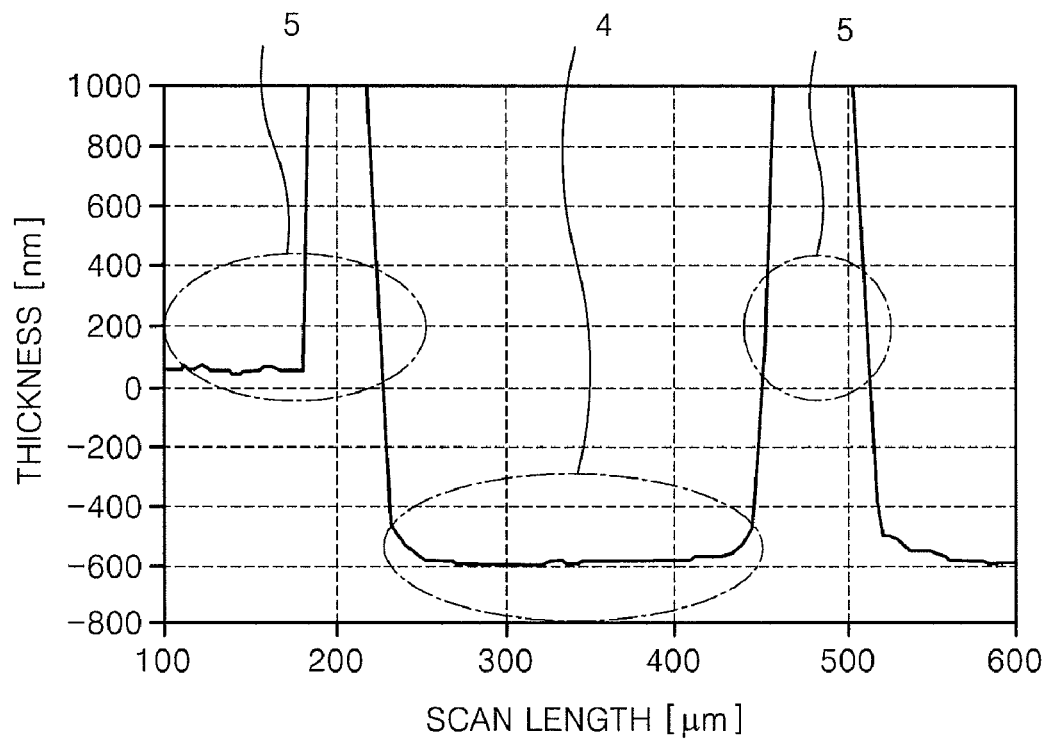
Figure 2:
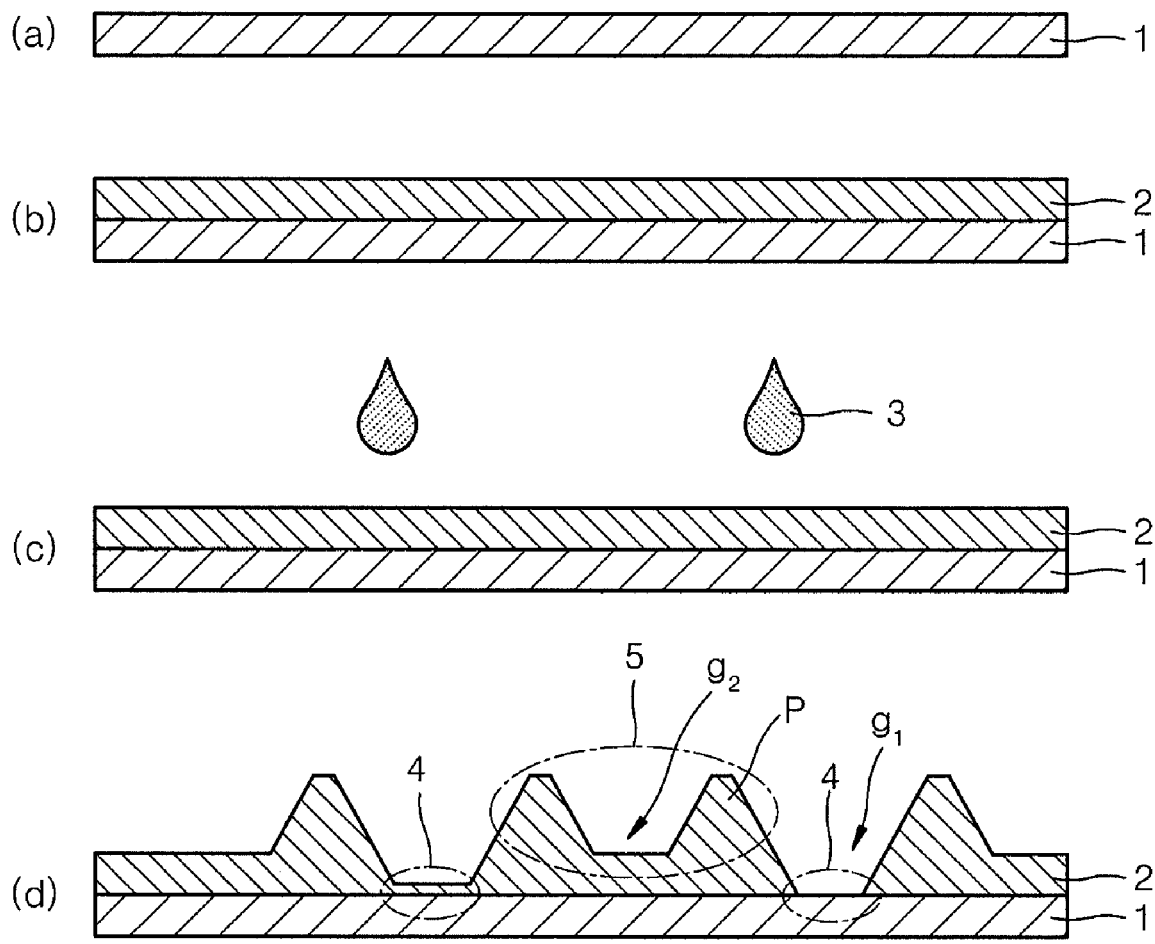
FIGS. 2A-2D illustrate an embodiment of a method of manufacturing a bank structure on a substrate that can be used for the manufacture of an OLED.

FIGS. 2A-2D illustrate an embodiment of a method of manufacturing a bank structure on a substrate that can be used for the manufacture of an OLED. First, referring to FIG. 2A, a substrate 1, which is in general preferably formed of glass or a plastic substrate and which preferably comprises a planar top surface, is provided. Referring to FIG. 2B, an organic insulating layer 2 is applied on the substrate 1. In some embodiments, the organic insulating layer 2 is applied over the whole substrate. Preferably, the organic insulating layer 2 has a generally uniform thickness on the substrate 1. Referring to FIG. 1C, an organic solvent 3 is applied onto a plurality of first areas 4 of the organic insulating layer 2, each first area corresponding to a pixel area. The organic solvent 3 forms a first groove g1 by dissolving the organic insulating material of the first area 4. Then, the dissolved organic insulating material is accumulated on an edge of the first area 4 and/or a second area 5 adjacent to the first area 4 to form at least one protrusion P. Referring to FIG. 2D, the thickness reduction in the first area 4 corresponds to the amount of applied organic solvent 3. As illustrated in the left first area 4 in FIG. 2D, the layer thickness has been reduced, but the organic insulating material has not been completely removed from the left first area 4. However, due to the use of a larger amount of the organic solvent 3 applied to the right first area 4, the organic insulting material has been completely removed from the right first area 4. The area between adjacent first areas 4 forms the second area 5 that contains accumulated insulating material. A plurality of protrusions P is formed on the second area 5 due to the accumulation of the dissolved organic insulating material. Therefore, the layer thickness of the second area 5 is increased while the layer thickness of the first areas 4 is decreased as the organic solvent is applied. Herein, the first area 4 corresponds to the pixel area and the second area 5 corresponds to the non-pixel area.

Figure 3:
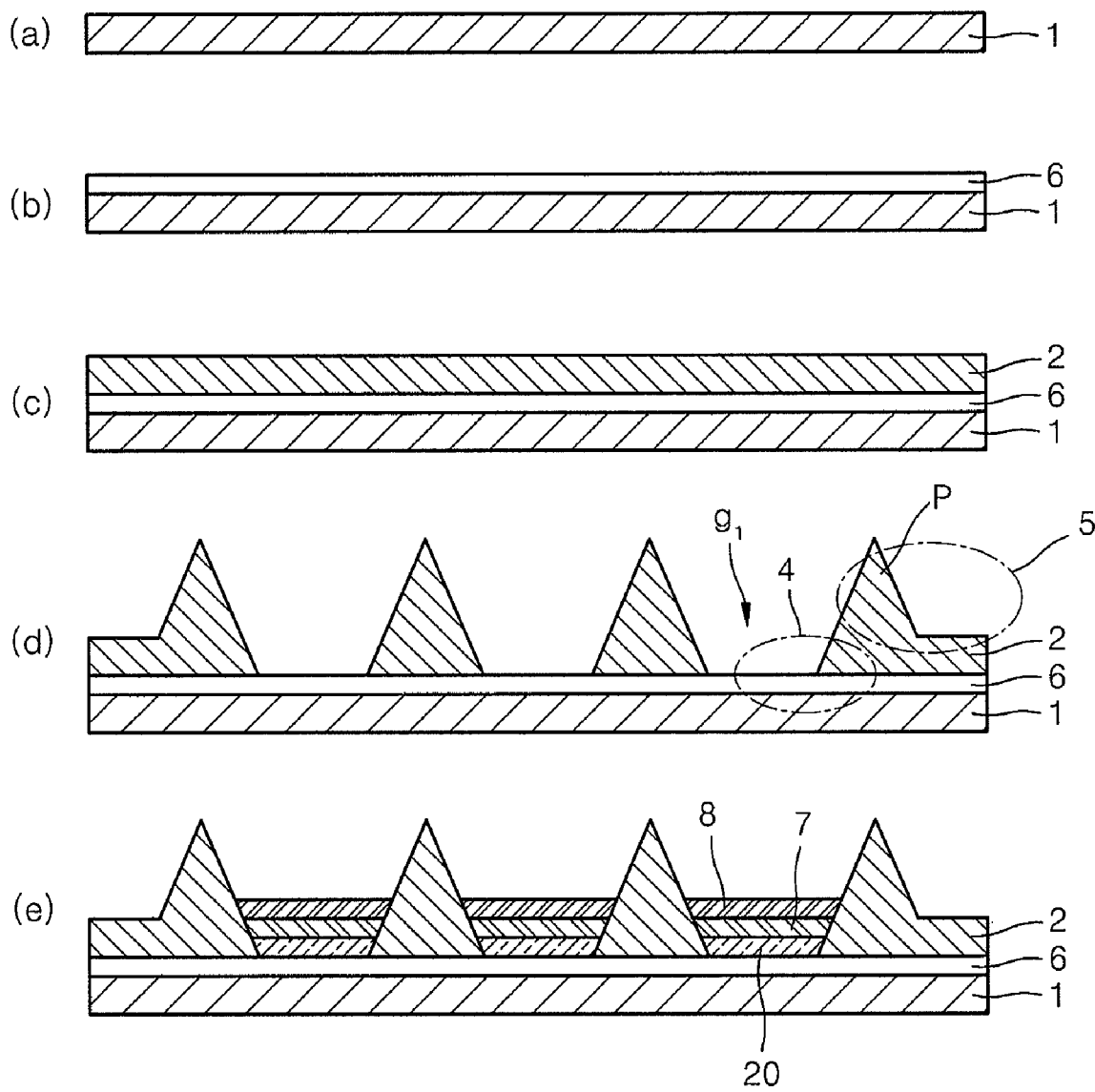
FIGS. 3A-3E illustrate an embodiment of a method of manufacturing an OLED.

FIGS. 3A-3E illustrate an embodiment of a method of manufacturing an OLED. First, a substrate 1 is provided as shown in FIG. 3A. Then, a first electrode 6, for example, an indium-tin oxide (ITO) layer is applied onto the substrate 1 as shown in FIG. 3B, and the first electrode layer 6 is covered by an organic insulating layer 2 as shown in FIG. 3C. Then, an organic solvent (not shown) is applied onto a plurality of first areas 4 of the organic insulating layer 2. Preferably, the organic solvent is applied onto first areas 4 of the organic insulating layer 2 that correspond to respective pixel areas, and are arranged in a matrix. The amount of organic solvent is controlled such that the organic insulating material is completely dissolved and removed from the first areas 4, thereby exposing the first electrode layer 6 in each of the first areas 4. Thus, each of the first areas 4 includes a first groove g1.

As shown in FIG. 3D, a second area 5 of the organic insulating layer 2 that is adjacent to the first area 4 includes a protrusion P due to the accumulation of the dissolved organic insulating material thereon. In the present embodiment, the second area 5 may correspond to a non-pixel area. According to the present embodiment, the patterning of a bank structure consisting of an insulating material in the non-pixel areas can be easily carried out by the operations of applying an organic insulating layer 2 and applying an organic solvent onto the respective areas in which the layer thickness is to be reduced or completely removed. Therefore, cost intensive process operations, such as photolithography processes, can be avoided.

As shown in FIG. 3E, the organic electroluminescent device can be finished by the application of an organic electroluminescent layer 7 and a second electrode 8. Optionally, a hole transport layer 20 can be formed between the first electrode 6 and the organic electroluminescent layer 7.

FIGS. 4A-4E illustrate an embodiment of a method of encapsulating two parallel conductive lines. Display devices such as OLED devices include a plurality of conductive lines such as data lines, gate lines, and connecting lines between transistors, capacitors, and light-emitting diodes. In particular, in the case of crossing conductive lines, at least one of the conductive lines can be encapsulated in order to prevent a short circuit between the crossing conductive lines.

Figure 4:
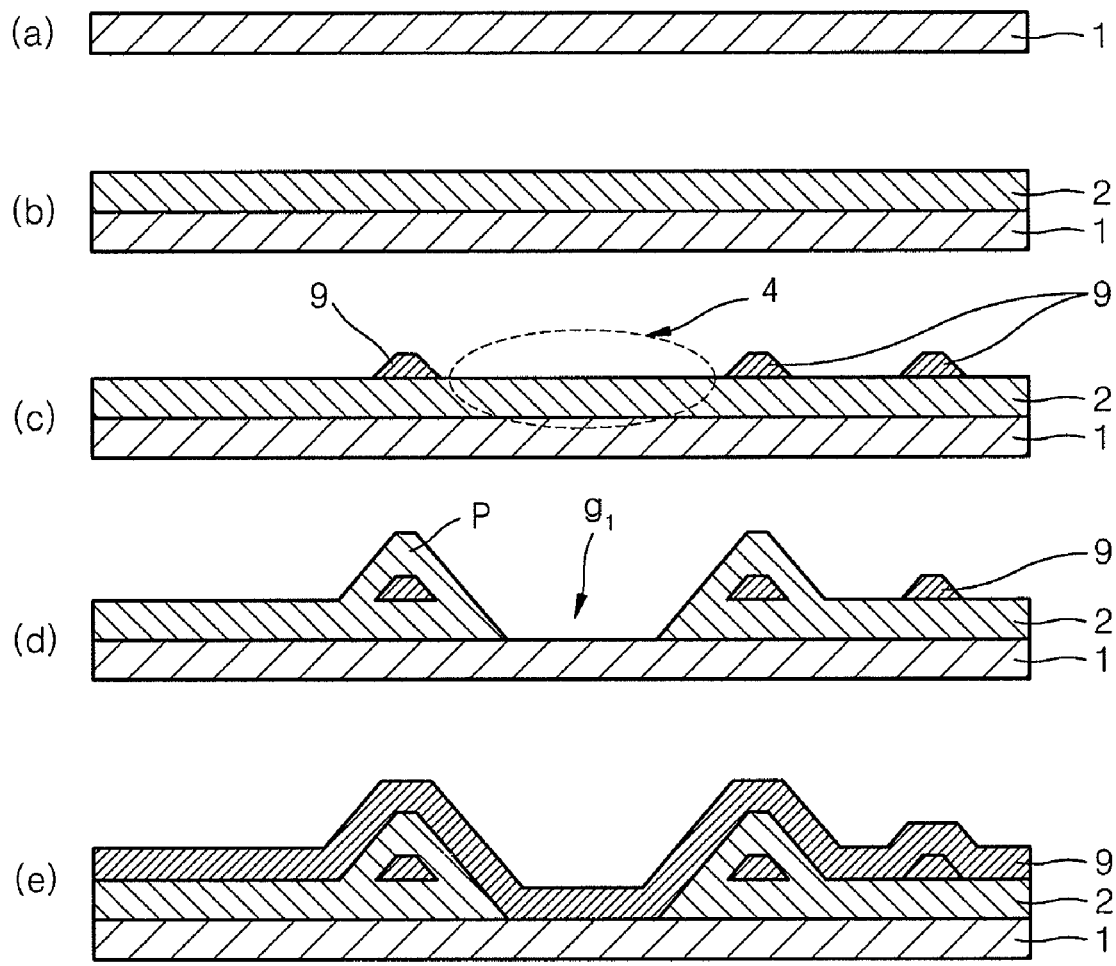
FIGS. 4A-4E illustrate an embodiment of a method for encapsulating two parallel conductive lines.
Figure 5:
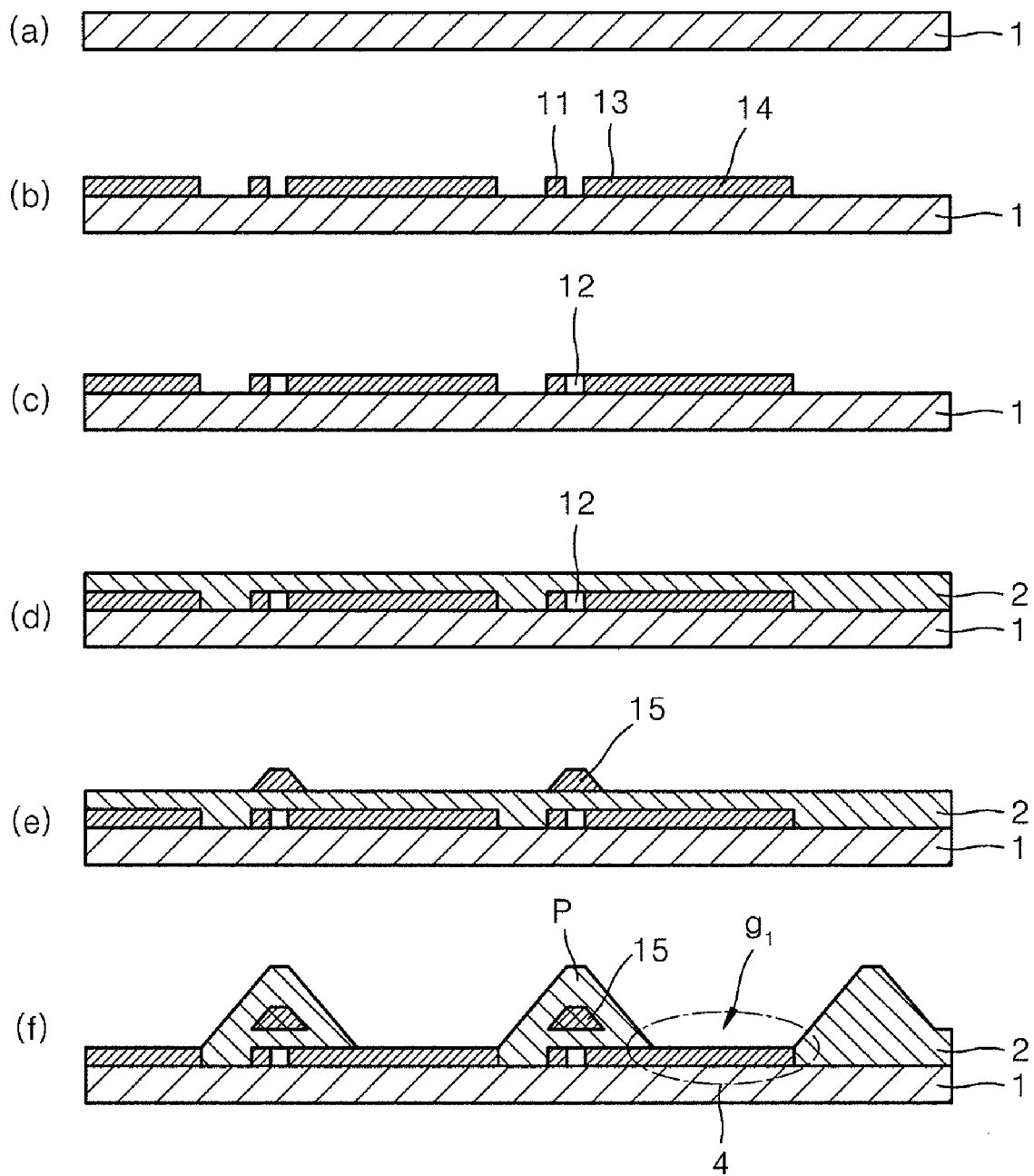
FIGS. 5A-5F illustrate an embodiment of a method of manufacturing a plurality of organic thin film transistors coupled to a pixel electrode.

According to the illustrated embodiment, a substrate 1, which is used for a display device, is provided as shown in FIG. 4A. Then, an organic insulating layer 2 is applied on the substrate 1. As shown in FIG. 4C, at least one conductive lines 9 is applied onto the organic insulating layer 2. The illustrated embodiment comprises a total of three conductive lines 9. In order to encapsulate the left and the middle conductive lines 9, an organic solvent (not shown) is applied in a first area 4 between the left and the middle conductive lines 9. Referring to FIG. 4D, the organic solvent dissolves the organic insulating material in the first area 4 to form a first groove g1. Then, the dissolved organic insulating material is accumulated in a periphery portion of the conductive lines 9, that is, in second areas to which the organic solvent is not applied to form protrusions P, thereby, encapsulating the left and the middle conductive lines 9 with organic insulating material. After the complete encapsulation of the left and the middle conductive lines 9, it is further possible to apply a crossing conductive line 9 as shown in FIG. 4E. The above-described method is preferably used for the manufacture of an organic electroluminescent display.

FIGS. 5A-5F illustrate an embodiment of a method of manufacturing a plurality of organic thin film transistors (OTFTs) coupled to a pixel electrode. Each OTFT includes a source electrode 11, a channel area 12 comprising a semiconductor material, a drain electrode 13, an organic insulating layer 2 and a gate electrode 15.

In order to cost effectively manufacture a structure comprising a plurality of the OTFTs that are each coupled to a respective pixel electrode 14, a substrate 1 is provided as shown in FIG. 5A. As shown in FIGS. 5B and 5C, a plurality of source electrodes 11, drain electrodes 13, pixel electrodes 14, and channel areas 12 are formed on the substrate 1. An organic insulating layer 2 is applied on the substrate 1, thereby, covering the plurality of source electrodes 11, channel areas 12, drain electrodes 13, and pixel electrodes 14. Then, as shown in FIG. 5E, each of the gate electrodes 15 is formed on the organic insulating layer 2 on an area that is located over the channel area 12 for each OTFT. In order to expose each of the pixel electrodes 14 and to encapsulate each of the gate electrodes 15, an organic solvent (not shown) is applied onto the plurality of first areas 4 defined by the pixel electrodes 14. The organic solvent dissolves the insulating material in the first area 4, thereby, exposing the pixel electrode 14 and further accumulating the organic material in peripheral second areas of the pixel portions, e.g., in the portions in which the gate electrodes 15 are located, and thereby, encapsulating the gate electrodes 15.

Figure 6:
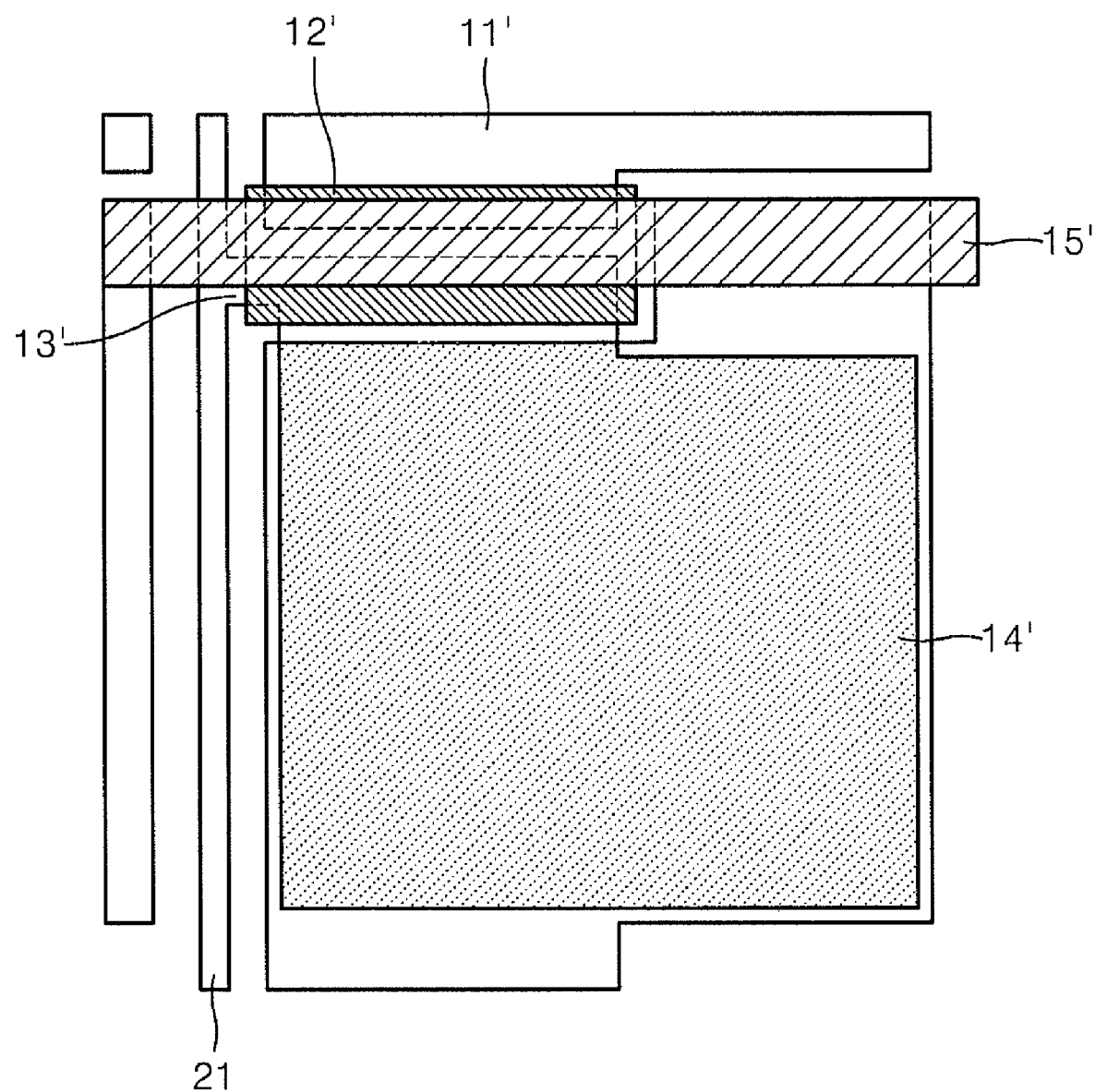
FIGS. 6, 7A, and 7B illustrate an embodiment of a method of manufacturing an electrophoretic display.
Figure 7A:
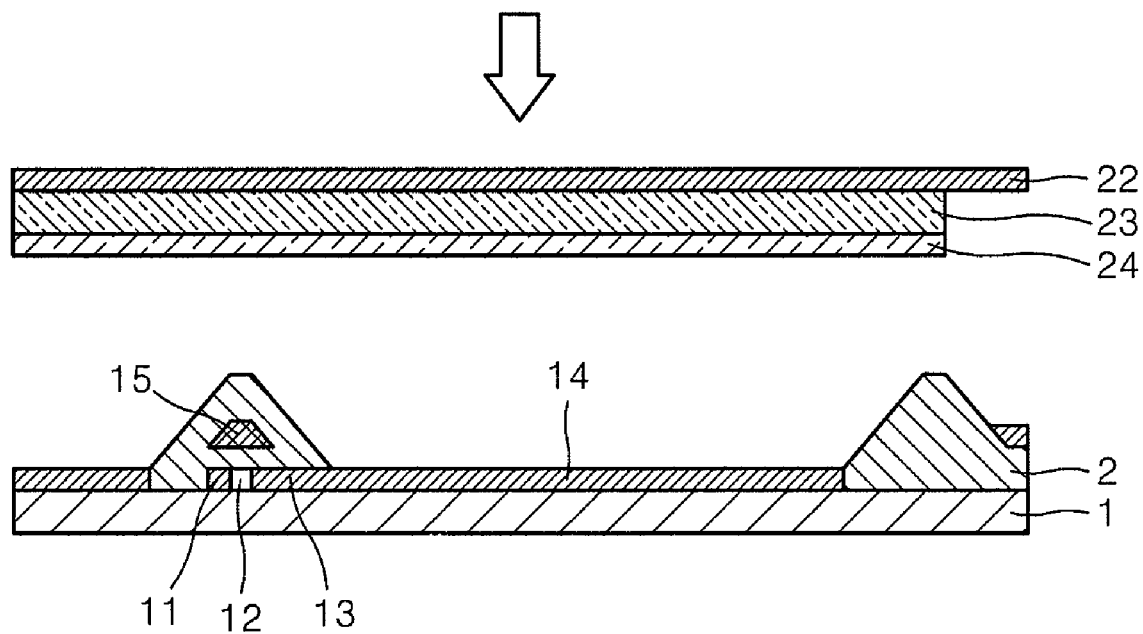
Figure 7B:
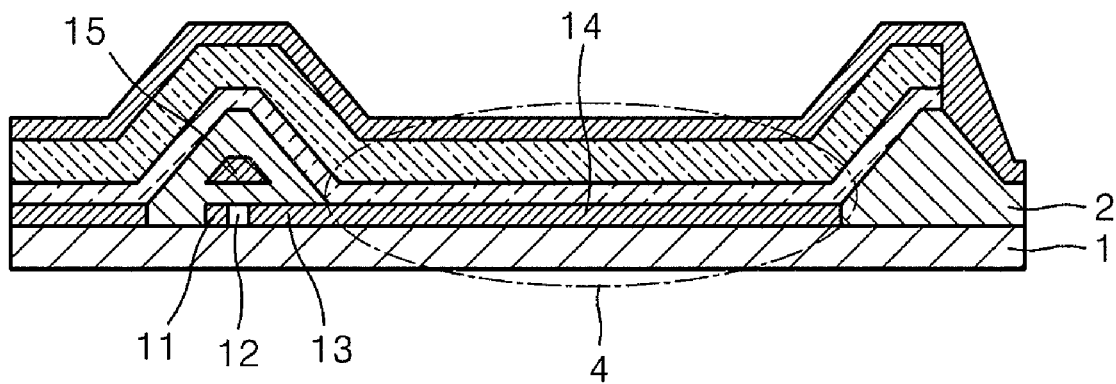

FIGS. 6, 7A, and 7B illustrate an embodiment of a method of manufacturing an electrophoretic display. FIG. 6 illustrates a top view of one pixel of an electrophoresis display that includes a plurality of pixels arranged in a matrix, wherein each pixel includes the OTFT comprising a source electrode 11', a drain electrode 13', a channel area 12' located between the source electrode 11' and the drain electrode 13', and a gate electrode, which is insulated from the channel area 12'. The gate electrode is coupled to one of a plurality of scan lines, and the source electrode 11' is coupled to one of a plurality of data lines 21, wherein the electrophoresis display comprises a plurality of data lines 21 and scan lines intersecting with each other, thereby, defining the plurality of pixels. Furthermore, each pixel includes a pixel electrode 14.

Figure 8:
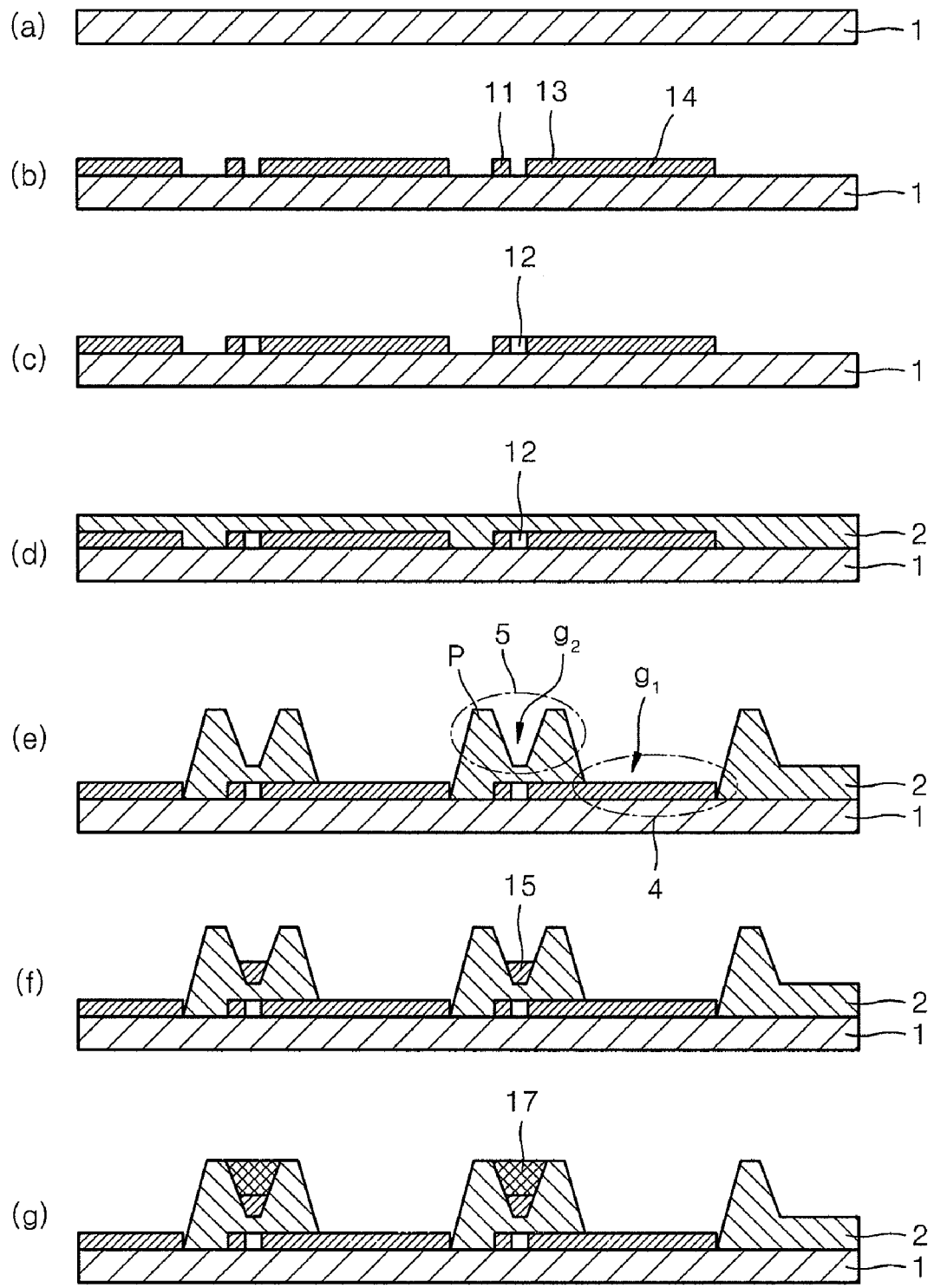
FIGS. 8A-8G illustrate another exemplary embodiment of a method of manufacturing an OLED.

FIG. 7A illustrates a first structure comprising an OTFT including the source electrode 11, the channel area 12, the drain electrode 13, and the drain electrode 13 coupled to the pixel electrode 14. Only the gate electrode is coupled to the pixel electrode 14. The first structure can be obtained by the method described above in connection with FIG. 5, or as will be described later in connection with FIG. 8. Furthermore, a second structure including a flexible substrate 22, an active electrophoretic layer 23, and a protection or adhesion layer 24 is provided as shown in FIG. 7A.

As shown in FIG. 7B, the electrophoretic display is manufactured by forming the second structure on the first structure illustrated in FIG. 7A. Accordingly, the electrophoretic display comprises a plurality of pixels, each pixel including an OTFT and an electrophoretic light emitting device. The OTFT comprises the source electrode 11, the channel area 12, the drain electrode 13, and the gate electrode 15, wherein the source electrode 11 is coupled one of the plurality of data lines 21 (FIG. 6) and the gate electrode 15 is coupled to one of the plurality of scan lines. The electrophoresis display includes the pixel electrode 14, the protection or adhesion layer 24, the active electrophoretic layer 23, and the flexible substrate 22. Furthermore, the electrophoretic display may include a facing electrode, the second layer from top in FIG. 7B but not having reference number.

FIGS. 8A-8G illustrate another exemplary embodiment of a method of manufacturing an OLED. The OLED has a pixel area including an OTFT that is coupled to the pixel electrode 14. First, as shown in FIGS. 8A to 8C, a substrate 1 is provided, and for each pixel area, a source electrode 11, a drain electrode 13, a channel area 12 consisting of a semiconductor material, and the pixel electrode 14 are formed on the substrate 1 to form each pixel. Then, as shown in FIG. 8D, a organic insulating layer 2 is applied on the substrate 1, thereby, covering a plurality of source electrodes 11, channel areas 12, drain electrodes 13, and pixel electrodes 14. As illustrated in FIG. 8E, the organic insulating layer 2 may include a first area 4 located on the pixel electrode 14 and a second area 5 located on the source electrode 11, the channel area 12, and the drain electrode 13. Returning to FIG. 8D, an organic solvent (not shown) is applied onto the plurality of first areas 4 of the organic insulating layer 2, thereby, exposing the pixel electrode 14. Thus, each first area 4 includes a first groove g1 in which the pixel electrode 14 is exposed. The dissolved organic insulating material is accumulated on the second area 5 that is adjacent to the first area 4. Accordingly, the second area 5 includes a protrusion P in which the thickness of the organic insulating layer 2 is increased. Furthermore, the second area 5 may include at least two protrusions P by accumulating the dissolved organic insulating material from adjacent first areas 4, thereby forming a second groove g2 between the at least two adjacent protrusions P. The second area 5 forms a double ridge structure comprising the second groove g2 in its middle portion. Referring to FIG. 8F, a gate electrode 15 is formed in the second groove g2. As shown in FIG. 8G, a passivation layer 17 is applied on the gate electrode 15. The structure as illustrated in FIG. 8G can be used for further manufacturing process operations for an organic electroluminescent display, an electrophoretic display, and the like. The above-described method is preferably used for the manufacture of an OLED display.

Figure 9:
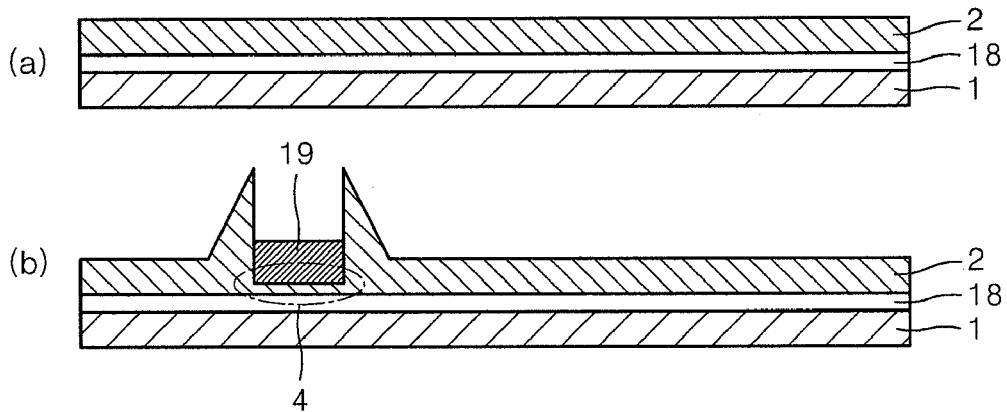
FIGS. 9A and 9B illustrate an embodiment of a method of manufacturing a capacitor.

FIGS. 9A and 9B illustrate an embodiment of a method of manufacturing a capacitor. Usually, for the manufacture of an active matrix organic electroluminescent display, each pixel circuit comprises at least one capacitor. Therefore, a plurality of capacitors is manufactured for an organic electroluminescent display. A large capacitance can result from a very thin insulating layer between two capacitor electrodes. However, according to conventional methods of applying an insulating layer, it is difficult to control the thickness of the insulating layer to a very low amount. Embodiments of the present method permit forming an organic insulating layer in which the thickness can be reduced and controlled to a desired amount by use of an organic solvent.

As shown in FIG. 9A, a substrate 1 comprising a first capacitor electrode 18 is provided. Then, an organic insulating layer 2 is formed on the first capacitor electrode 18. In order to reduce the layer thickness of the organic insulating layer 2, an organic solvent (not shown) is applied to a first area 4 of the organic insulating layer 2, thereby, reducing and controlling the layer thickness to a desired amount. Then, as shown in FIG. 9B, the second capacitor electrode 19 is applied to the first area 4, thereby, forming a capacitor. Such capacitor is preferably used for the manufacture of an active matrix organic electroluminescent display.

Figure 10:
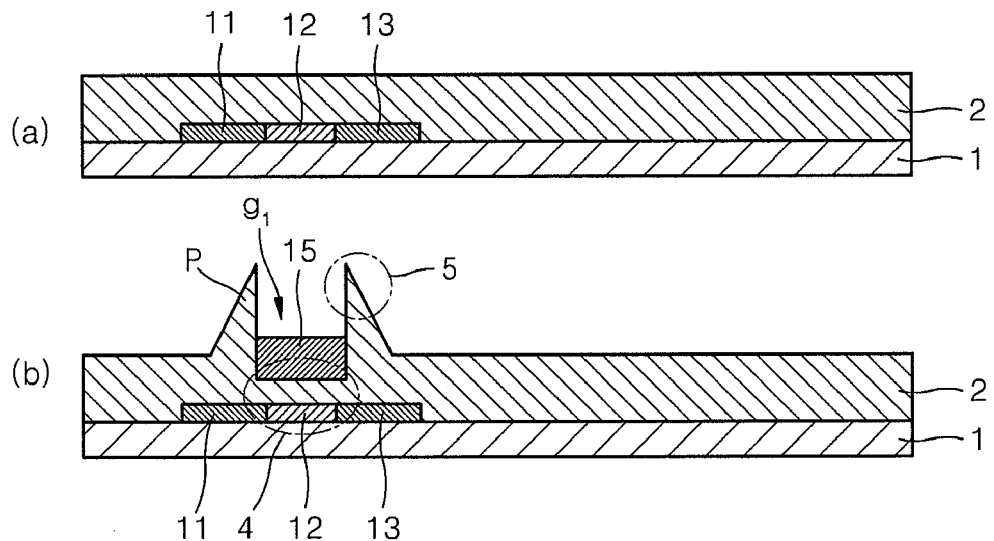
FIGS. 10A and 10B illustrate an embodiment of a method of manufacturing an organic thin film transistor.

FIGS. 10A and 10B illustrate an embodiment of a method of manufacturing an organic thin film transistor. For the manufacture of an active matrix organic electroluminescent display, a plurality of thin film transistors is manufactured for each pixel. In order to obtain a uniform brightness over the whole active matrix organic electroluminescent display, it is desirable to form a plurality of the organic thin film transistors having uniform electrical characteristics, and it is also desirable to form the gate electrodes 15 with an uniform distance from the channel area 12, which is insulated by a gate insulating layer, on the substrate 1.

As shown in FIG. 10A, the substrate 1 comprises a source electrode 11, a channel area 12 comprising a semiconductor material, and a drain electrode 13. Then, an organic insulating layer 2 is applied on the substrate 1 to cover the source electrode 11, the channel area 12, and the drain electrode 13. The thickness of the organic insulating layer 2 is greater than about 1 µm. Then, an organic solvent (not shown) is applied on the layer in a first area 4 that is located above the channel area 12, thereby, reducing and controlling the thickness of the organic insulating layer 2 to less than about 1 µm. As shown in FIG. 10B, a first groove g1 is formed in the first area 4 of the organic insulating layer 2 to which the organic solvent is applied, and a protrusion P is formed in a second area 5 adjacent to the first area 4, to which the organic solvent is not applied. Then, the gate electrode 15 is applied onto the first groove g1. The above-described method for the manufacture of the organic thin film transistor is preferably used for the manufacture of an organic electroluminescent display.

Figure 11:
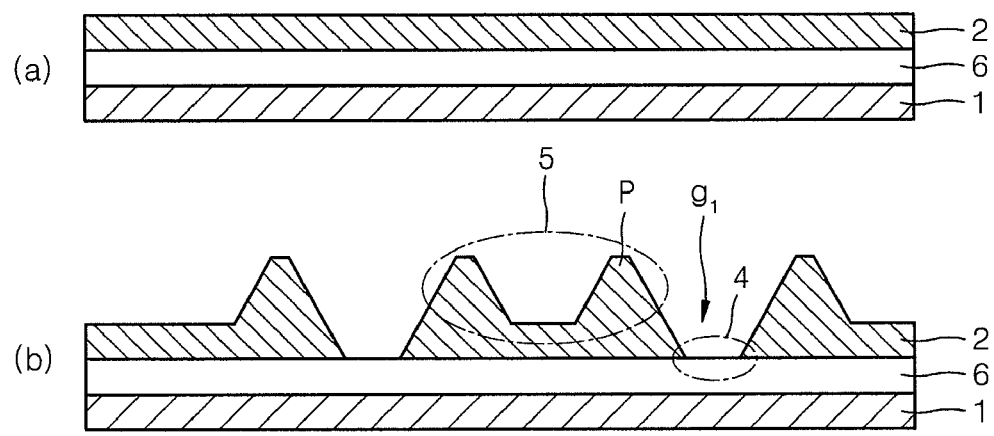
FIGS. 11A and 11B illustrate an embodiment of a method of manufacturing a pixel defining layer.

FIGS. 11A and 11B illustrate an embodiment of a method of manufacturing a pixel defining layer. During the manufacture of an active matrix organic electroluminescent display, it is usually desirable to form a pixel defining layer.

According to the illustrated embodiment, a substrate 1 including a first electrode 6 is provided. As shown in FIG. 11A, an organic insulating layer 2 is applied on the first electrode 6. Then, an organic solvent (not shown) is applied to a first area 4 of the organic insulating layer 2. The first area 4 corresponds to a pixel area in the active matrix organic electroluminescent display. As shown in FIG. 11B, the organic solvent dissolves the organic insulating material in the first area 4, thereby, forming a first groove g1 and exposing the first electrode 6 at the bottom of the first groove g1. The dissolved organic insulating material is accumulated on a second area 5 adjacent to the first area 4 so as to form a protrusion P, and thus, the pixel defining layer is formed.

The above-described method of forming the pixel defining layer is preferably used for the manufacture of an active matrix organic electroluminescent display. In general, an organic electroluminescent display comprises a plurality of pixels arranged in a matrix, each pixel comprising at least one organic thin film transistor, wherein a source electrode of the organic thin film transistor is coupled to a data line, a gate electrode of the organic thin film transistor is coupled to a select line of the organic electroluminescent display, and wherein the drain of the thin film transistor is coupled to a pixel electrode. Each pixel further includes a facing electrode and an organic electroluminescent layer. As mentioned above, each pixel may further include a pixel defining layer, and furthermore, it may be desirable to arrange contact holes in insulating layers, for example, to couple the drain electrode with the pixel electrode.

Figure 12:
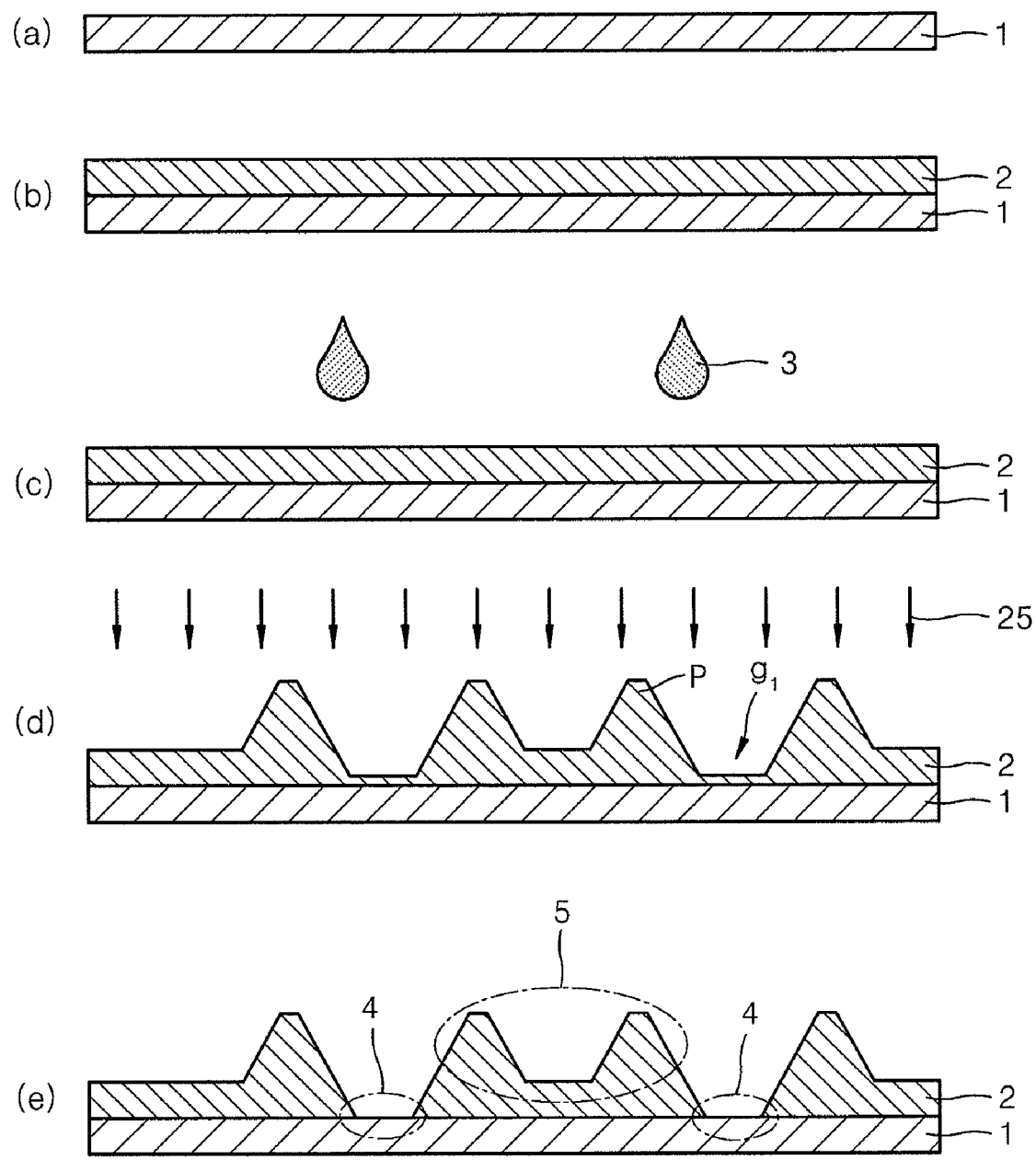
FIGS. 12A-12E illustrate an embodiment of a method of manufacturing a plurality of contact holes.

FIGS. 12A-12E illustrate an embodiment of a method of manufacturing a plurality of contact holes according to the present invention. A substrate 1 that preferably comprises glass or plastic is provided, and an organic insulating layer 2 is applied on the substrate 1. Then, as shown in FIG. 12C, an organic solvent 3 is applied on the organic insulating layer 2 onto a first area 4 in which a contact hole/via hole is desired. Accordingly, a first groove g1 is formed in the first area 4 of the organic insulating layer 2 to which the organic solvent 3 was applied, and a protrusion P is formed in a second area 5, which is adjacent to the first area 4, and to which the organic solvent is not applied. As shown in FIG. 12D, the organic insulating layer 2 is sometimes not completely removed from the area where the contact hole is desired because small amounts of organic insulating material remain in the contact hole. In order to decrease the resistance of the contact hole, a plasma-etching process is performed to provide the structure shown in FIG. 12D. Therefore, the organic insulating layer 2 is completely removed from the contact holes.

Provided herein is a method of manufacturing an electronic device including a bank structure requires a fewer number of processes. Particularly, a direct patterning of an organic insulating layer comprising, for example, fluorinated organic polymers, is possible by using an organic solvent to form a bank structure. Thus, the bank structure can be easily formed for later printing processes in the manufacture of an electronic device such as an OLED that requires a bank structure. Furthermore, embodiments of the method are roll to roll compatible, therefore, flexible substrates are processable.

While certain embodiments have been particularly shown and described, it will be understood by one of ordinary skill in the art that various changes in form and details may be made therein without departing from the spirit and scope of the present disclosure, the scope of which is defined by the following claims.

What is claimed is:

1. A method of manufacturing an electronic device, the method comprising:
   providing a substrate;
   applying an organic insulating layer comprising an organic insulating material on the substrate; and
   applying at least one conductive line onto at least one second area of the organic insulating layer; and
   patterning the organic insulating layer by applying an organic solvent to at least one first area of the organic insulating layer,
   wherein in the patterning the organic insulating layer, dissolving the organic insulating material of the first area by applying the organic solvent, and encapsulating the at least one conductive line with the dissolved organic insulating material.

2. The method of claim 1, wherein the organic insulating material comprises a fluorinated organic polymer.

3. The method of claim 2, wherein the organic insulating material comprises a material selected from the group consisting of polyhexafluoropropene, fluoronated poly-para-xylene, fluorinated polyaryl ether ketones, fluorinated polyalkyl ethers, fluorinated polyamide, fluorinated ethylene/propylene copolymer, poly-(1,2-difluoromethylene)-perfluoro-tetrahydrofuran, and polytetrafluorethylene.

4. The method of claim 1, wherein the organic insulating material comprises a material selected from the group consisting of polyvinylphenol, polyvinyl alcohol, polyethylene, polystyrene, poly(methylmethacrylate), poly(butylmethacrylate), poly(cyclohexylmethacrylate), polyisobutylene, and polypropylene.

5. The method of claim 1, wherein the organic solvent comprises a non-polar solvent.

6. The method of claim 5, wherein the organic solvent comprises a solvent selected from the group consisting of methylene chloride, tetrahydrofuran, xylene, n-hexane, toluene, cyclohexane, anisole, 3,4-dimethylanisole, 1,2-dichlorobenzene, tetralin, 1,2,4-trimethylbenzene, 1,2,3-trimethylbenzene, 1,3,5-trimethylbenzene, methyl benzoate, ethyl benzoate, perfluoroheptane, perfluorooctane, perfluorononane, perfluorodecane, perfluoroundecane, perfluorododecane, perfluorodecalin, perfluoromethyldecalin, perfluoro-dimethyl ether, perfluoro-tetrahydrofuran, perfluoromethyltetrahydrofuran, perfluoro-ethyltetrahydrofuran, perfluoro-dipropyl ether, perfluoro-diisopropyl ether, perfluoro-ethylpropyl ether, perfluoro-2-butyltetrahydrofuran, perfluorinated saturated tertiary amines, heptacosafluorotributylamine, and methoxynonafluorobutane.

7. The method of claim 1, further comprising carrying out a plasma-etching of the organic insulating layer.

8. The method of claim 1, further comprising forming a first conductive layer on the substrate.

9. The method of claim 8, wherein an organic insulating layer is applied onto the substrate having a first conductive layer, and the organic insulating layer is patterned by applying an organic solvent to the organic insulating layer to expose the first conductive layer.

10. The method of claim 9, further comprising forming an electroluminescent layer on the exposed first conductive layer.

11. The method of claim 8, wherein an organic insulating layer is applied onto the substrate having the first conductive layer, and the organic insulating layer is patterned by applying an organic solvent to the organic insulating layer not to expose the first conductive layer.

12. The method of claim 11, further comprising forming a second conductive layer on the patterned organic insulating layer.

13. The method of claim 1, wherein in the patterning the organic insulating layer, the thickness of the organic insulating layer is reduced in a plurality of first areas by applying the organic solvent in each of the first area, and the thickness of the organic insulating layer is increased in each of second areas, which are defined by an area between adjacent first areas, by accumulating the organic insulating material, which is dissolved by the organic solvent onto the second area.

14. A method of manufacturing an organic electroluminescent display, the method comprising:
 providing a substrate;
 applying a source electrode, a channel area, a drain electrode and a pixel electrode onto the substrate;
 applying an organic insulating layer comprising an organic insulating material to cover the source electrode, the channel area, the drain electrode and the pixel electrode; and
 removing the organic insulating material of a first area by applying an organic solvent to the first area of the organic insulating layer corresponding to the top surface of the pixel electrode.

15. The method of claim 14, wherein the organic insulating material of the first area is removed by applying the organic solvent to the first area so as to expose the pixel electrode.

16. The method of claim 14, further comprising plasma-etching to expose the pixel electrode.

17. The method of claim 14, further comprising forming a gate electrode on a second area of the organic insulating layer corresponding to the top surface of the channel area.

18. The method of claim 17, wherein the organic solvent is applied onto the first area to dissolve the organic insulating material and the dissolved organic insulating material covers the gate electrode after the gate electrode has been formed on the organic insulating layer.

19. The method of claim 17, wherein the organic solvent is applied onto the first area to dissolve the organic insulating material, and the dissolved organic insulating material is accumulated on the second area adjacent to the first area, thereby, forming a gate electrode on the accumulated organic insulating material.

* * * * *

UNITED STATES PATENT AND TRADEMARK OFFICE
CERTIFICATE OF CORRECTION

PATENT NO. : 7,993,960 B2  Page 1 of 1
APPLICATION NO. : 11/956163
DATED : August 9, 2011
INVENTOR(S) : Mathea et al.

It is certified that error appears in the above-identified patent and that said Letters Patent is hereby corrected as shown below:

At column 8, line 27, please delete "polytetrafluorethylene." and insert --polytetrafluoroethylene.--, therefor.

At column 8, line 38, please delete "perflouromethyltetrahydrofuran," and insert -- perfluoromethyltetrahydrofuran,--, therefor.

At column 8, line 38-39, please delete "perflouro-ethyltetrahydrofuran," and insert --perfluoro-ethyltetrahydrofuran,--, therefor.

At column 8, line 39, please delete "perflouro-dipropyl" and insert --perfluoro-dipropyl--, therefor.

At column 8, line 39, please delete "perflourodiisopropyl" and insert --perfluorodiisopropyl--, therefor.

At column 14, line 64, please delete "polytetrafluorethylene." and insert --polytetrafluoroethylene.--, therefor.

Signed and Sealed this
Sixth Day of March, 2012

David J. Kappos
*Director of the United States Patent and Trademark Office*